United States Patent [19]
Warner

[11] Patent Number: 6,043,716
[45] Date of Patent: Mar. 28, 2000

[54] CHARGE PUMP FOR PHASE LOCKED LOOP INCLUDING MAIN AND AUXILIARY PUMP CIRCUITS

[75] Inventor: David John Warner, Addlestone, United Kingdom

[73] Assignee: LSI Logic Corporation, Milpitas, Calif.

[21] Appl. No.: 09/059,243

[22] Filed: Apr. 13, 1998

[30] Foreign Application Priority Data

Apr. 16, 1997 [GB] United Kingdom .................... 9707707

[51] Int. Cl.⁷ .................................................. H03L 7/093
[52] U.S. Cl. ............................................. 331/17; 327/157
[58] Field of Search .............................. 331/17; 327/148, 327/157, 536

[56] References Cited

U.S. PATENT DOCUMENTS

| | | | |
|---|---|---|---|
| 4,885,552 | 12/1989 | Boudewijns | 331/17 |
| 5,394,320 | 2/1995 | Blodgett | 363/60 |

FOREIGN PATENT DOCUMENTS

| | | |
|---|---|---|
| 0 594 230 A1 | 4/1994 | European Pat. Off. . |
| 2 232 829 | 12/1990 | United Kingdom . |
| 2 296 605 | 7/1996 | United Kingdom . |

Primary Examiner—Siegfried H. Grimm

[57] ABSTRACT

A charge pump includes a main pump circuit having a main first and second switching transistors and an auxiliary pump circuit. The charge pump is configured to provide a variable bias to at least the first switching transistor in response to operation of the auxiliary pump circuit. The auxiliary pump circuit can include auxiliary first and second switching transistors corresponding to the first and second switching transistors of the main pump circuit. The auxiliary first and second switching transistors control a charging level for auxiliary charge storage. A bias transistor of a controllable current source for the first switching transistor of the auxiliary pump circuit is responsive to a charging level of the auxiliary charge storage to provide a self-regulating bias to the first switching transistor of the auxiliary pump circuit. A bias transistor of a controllable current source for the first switching transistor of the main pump circuit is also responsive to a charging level of the charge storage for regulating the operation of the main pump circuit. A further main pump circuit can also be provided with the further main pump circuit also being regulated by the operation of the auxiliary pump circuit. The first switching transistors are typically PMOS transistors, with the second switching transistors typically being NMOS transistors.

21 Claims, 4 Drawing Sheets

CHARGE PUMP FOR PHASE LOCKED LOOP INCLUDING MAIN AND AUXILIARY PUMP CIRCUITS

The invention relates to charge pumps and to circuitry including charge pumps.

Charge pumps are used, for example, in phase locked loop circuits including CMOS phase locked loop circuits for high frequency applications.

A prior proposal for a phase locked loop circuit for locking to a 155 MHz variable data rate comprises a number of charge pumps. The charge pumps include a reference current source, which is mirrored and switched to provide current pulses to maintain charge on a capacitive node. In equilibrium conditions, equal and opposite current pulses should be applied alternately by the switching of PMOS and NMOS transistors, with the net potential state of the capacitive node reflecting the relative differential in time between the switching signals. Layout methods are used to make the components of the charge pump as functionally similar as possible to provide stable operation of the charge pump. However, variables in the manufacture and operation of the charge pump can affect its function so as to deviate from the ideal. Such variables include process variables during manufacture, and voltage and temperature variations in use. As a result of the high demands made on the circuit technology in order to operate at high frequencies, under certain circumstances the charge node will assume a different potential value from the intended equilibrium point which can cause dependent circuitry to operate at a non-intended level. As yet higher frequencies of operation are demanded, the difficulties of obtaining matched behaviour increase.

Accordingly, an aim of the present invention is to provide an improved charge pump which is better able to compensate for variations in process and operating parameters.

In accordance with an aspect of the invention, there is provided a charge pump comprising:

a main pump circuit having a main first and second switching transistors; and an auxiliary pump circuit, the charge pump being configured to provide a variable bias to at least the first switching transistor in response to operation of the auxiliary pump circuit.

The provision of a separate auxiliary pump circuit enables the circuit to be used as a form of control to provide signals for adjusting a bias of one of the switching transistors of the main pump circuit. The auxiliary pump circuit can be monitored and from the monitor control signals for controlling the main pump circuit the bias can be generated. In this way the operation of at least one of the main pump circuit switching transistors can be controlled. Where there are separate PMOS and NMOS switching transistors, it will typically only be necessary to control the bias to the PMOS transistor.

Preferably, the auxiliary pump circuit comprises auxiliary first and second switching transistors. In this way the configuration of the main pump circuit can be mirrored in the auxiliary pump circuit.

Preferably, the monitoring of the operation of the auxiliary pump circuit is achieved by arranging that the auxiliary first and second switching transistors are coupled or couplable to auxiliary charge storage for controlling a charging level for the charge storage. The charge storage is advantageously formed as part of or immediately adjacent to the auxiliary pump circuit. The charge storage could comprise one or more transistors and/or one or more capacitors and/or any other charge storage arrangement (for example a second order low pass filter similar to a second order low pass filter which can be used for the main charge pump charge storage).

Preferably, the auxiliary pump circuit includes a self-regulating feedback loop. In this way the auxiliary pump circuit effectively monitors its own operation.

In one embodiment, an auxiliary controllable current source is connected between the auxiliary first switching transistor and a voltage supply line, the auxiliary controllable current source being responsive to a charging level of the charge storage, or the voltage at a supply terminal to the charge storage, to provide a self-regulating bias to the first switching transistor. The auxiliary controllable current source preferably comprises a bias transistor responsive to a charging level of the charge storage to provide a self-regulating bias to the first switching transistor.

In this embodiment a main controllable current source is connected between the main first switching transistor and a voltage supply line, the main controllable current source being responsive to operation of the auxiliary pump circuit. Preferably, the main controllable current source comprises a bias transistor responsive to a charging level of the charge storage, or the voltage at a supply terminal to the charge storage, to provide a self-regulating bias to the main first switching transistor.

In an embodiment of the invention the charge pump comprises a further main pump circuit having further main first and second switching transistors, the charge pump being configured to provide a variable bias to at least the further main first switching transistor in response to operation of the auxiliary pump circuit. With the further main pump circuit also responsive to the same auxiliary pump circuit, savings in circuitry and reliability of operation can be provided.

Preferably, the further main controllable current source comprises a bias transistor responsive to a charging level of the charge storage, or the voltage at a supply terminal to the charge storage, to provide a self-regulating bias to the further main first switching transistor.

In a preferred embodiment of the invention, the first switching transistor is a PMOS transistor.

The auxiliary pump circuit is preferably configured to be operable at a maximum operational frequency for the charge pump circuit, preferably by arranging for the gates of each of the auxiliary first and second switching transistors to be driven by a clock frequency corresponding to the maximum operational frequency clock.

Preferably, each pump circuit has substantially the same geometry.

Preferably also, the charge pump comprises a current mirror reference circuit.

The invention also provides a phase locked loop comprising a charge pump as defined above. The charge pump circuit and/or the phase lock loop can be integrated in an integrated circuit.

An exemplary embodiment of the invention is described hereinafter, by way of example only, with reference to the accompanying drawings in which like reference signs relate to like parts and in which like:

FIG. 1 is a schematic block diagram of a high speed phase locked loop 10.

The phase locked loop can be arranged to phase lock to a high frequency variable data rate, for example a 622 MHz data rate or higher.

Figure 1:
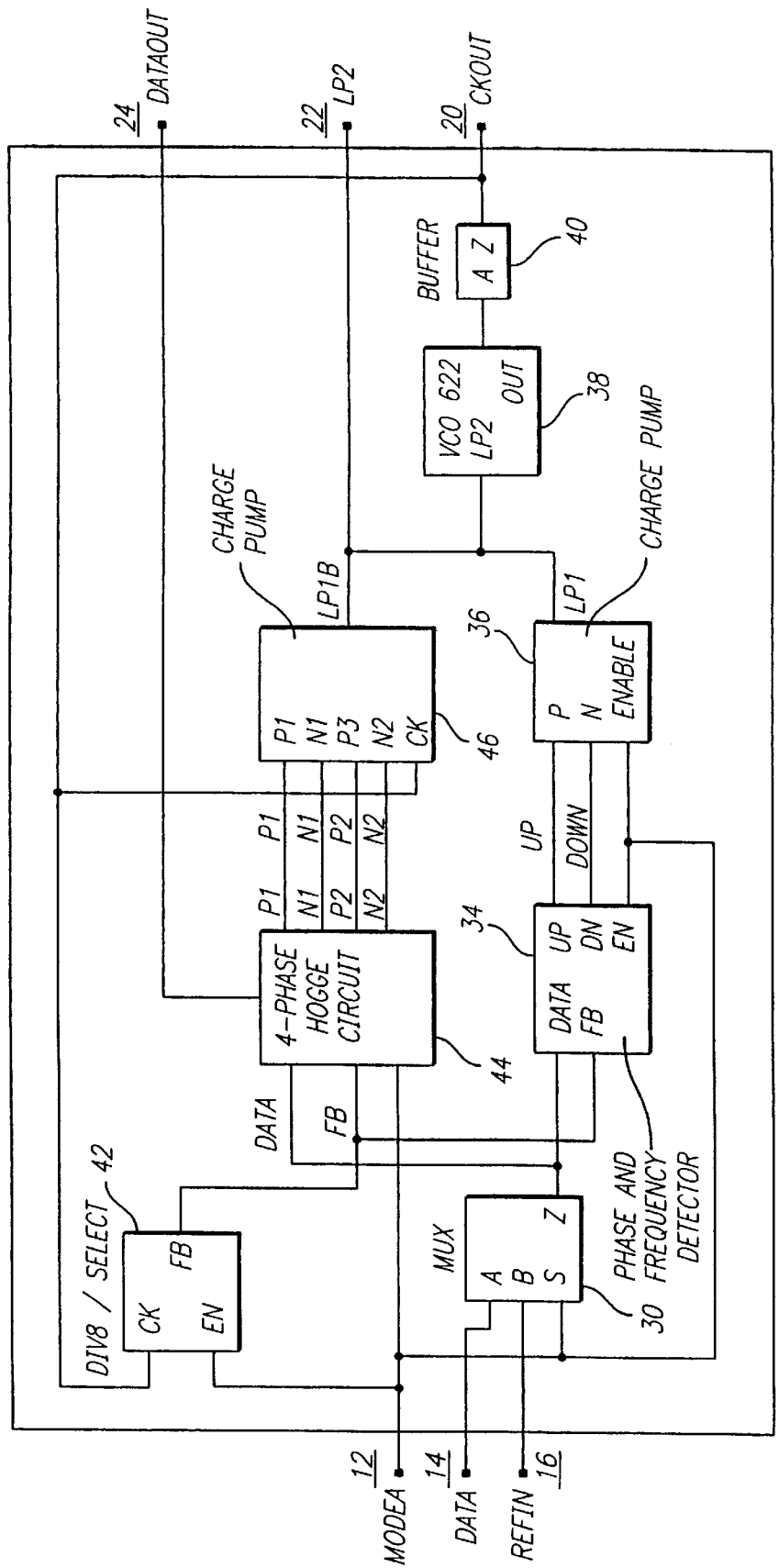
FIG. 1 is a schematic block diagram of an example of a phase locked loop incorporating an embodiment of a charge pump in accordance with the present invention.

The phase locked loop of FIG. 1 comprises a multiplexer 30, a phase and frequency detector circuit 34, a first charge pump 36, a voltage controlled oscillator 38, and a buffer circuit 40. It also comprises a divide-by-eight/selector circuit 42, a HOGGE4 circuit (ie, a conventional four phase Hogge circuit) 44 and a second charge pump 46.

The operation of the circuit of FIG. 1 will now be described in more detail. The circuit of FIG. 1 operates in two phases under the control of MODE signals. A table showing the different modes is shown at the top of FIG. 1.

In a first phase, the circuit is caused to lock to a fixed frequency (i.e. for a 622 MHz clock), and in a second phase the circuit is switched over to receive a random data pattern based on the fixed clock frequency, but having a variable bit length.

Figure 4:
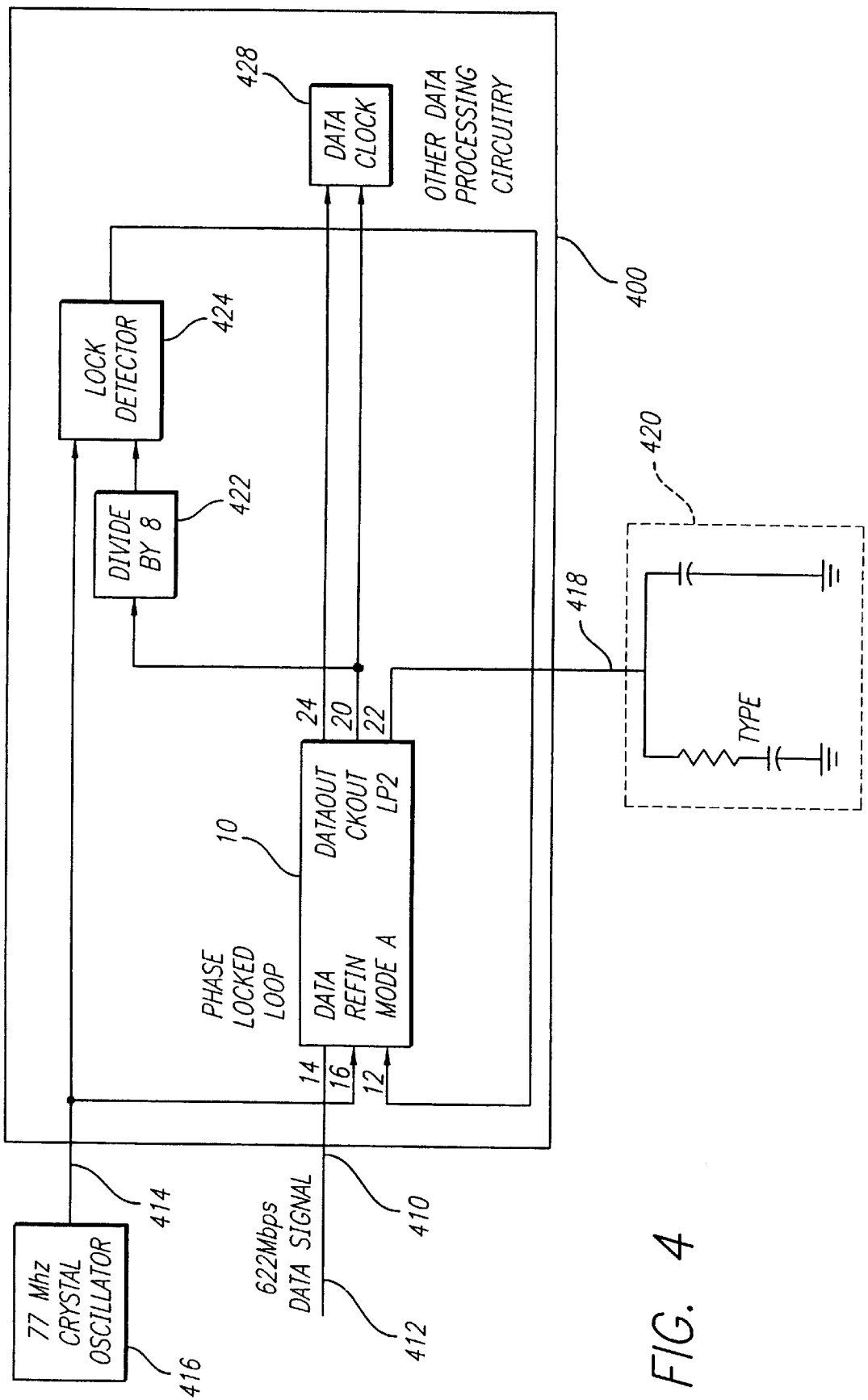
FIG. 4 is a schematic representation of an integrated circuit including the phase locked loop of FIG. 1.

In a first phase, reference data REFIN at a fixed frequency (622/8=77 MHz) is supplied at a reference input 16. When a high MODEA signal is supplied at an input 12, which causes a multiplexer 30 to select the reference input 16 and to pass the reference input to a data input DATA of a phase and frequency detector 34. The high MODEA signal also causes the phase and frequency detector 34 and a first charge pump 36 to be enabled. The phase and frequency detector 34 compares the reference data input DATA to signals fed back from a divide-by-eight/selector 42 to a FB input of the phase and frequency detector 34. The phase and frequency detector 34 outputs up UP and down DN, signals, respectively, depending on differences between the signals input at the DATA and FB inputs to the phase and frequency detector 34. The charge pump 36 causes an external filter capacitor at a terminal LP2 22 (for example implemented as a second order low pass filter as illustrated in FIG. 4) to be charged and discharged in accordance with the up UP and down DN signals, respectively.

A voltage controlled oscillator 38 is connected to monitor the voltage levels (i.e. the charging levels) at the terminal LP2 22. Effectively, therefore, the external filter capacitor acts as a smoothing capacitor for smoothing out a control voltage which is supplied at the control input LP2 of the voltage controlled oscillator 38. The output of the voltage controlled oscillator 38 is buffered at a buffer 40 and is then supplied as the output clock CKOUT 20 at the desired frequency, in the present example 622 MHz.

The output of the buffer 40 is also fed back to the divide-by-eight/selector circuit 42. The divide-by-eight function of the selector circuit 42 is enabled by a high MODEA signal supplied at the input 12. This divides the 622 MHz signal by eight to produce a 77 MHz signal at the FB output of the divide-by-eight/selector 42, which is fed to the FB input of the phase and frequency detector 34. In this manner, the VCO is caused to generate the CKOUT signal locked at the reference frequency.

In the second phase of operation, the circuit switches over to receipt of a random data pattern based on the 622 MHz clock, but at any bit length. In this case, there is no clock to compare, so that it is necessary to look at the phasing of data edges in order to provide phase locking. In order to provide phase locking, a conventional HOGGE4 circuit (ie, a four phase Hogge circuit) is used. When the MODEA signal goes low, the multiplexer 30 then supplies data DATA from an input terminal 14 to an output Z of the multiplexer 30. The phase and frequency detector 34 and the first charge pump 36 are also disabled when the MODEA signal goes low. The divide-by-eight function of the selector circuit 42 is disabled so that the 622 MHz CK signal may be passed directly to form the FB signal for input to the Hogge circuit 44. The Hogge circuit 44 is then enabled by MODEA signal going low. The Hogge circuit 44 is then operative in a known manner to compare data at its DATA input to signals supplied at its FB input. The Hogge circuit 44 supplies correction pulses P1, N1, P2, N2 in sequence from its like referenced outputs to like referenced inputs of the second charge pump 46. The P1, N1, P2 and N2 are very high frequency pulses which are only nanoseconds long. The second charge pump 46 includes two pump circuits which operate to provide signals at the LP1B output for controlling the charge stored on the capacitor (not shown) at the terminal LP2. Where there are minor variations in the input clock frequency, variations in the charge level of the storage capacitor will occur, causing differences in the voltage supplied at the LP2 input to the voltage controlled oscillator, therefore providing control of the operating frequency. In equilibrium conditions, the charged node should assume an intended equilibrium potential value. The purpose of this will be described later in relation to an example of a charge pump 46 in accordance with an embodiment of the invention. It will also be noted in FIG. 1 that an output of the Hogge circuit 44 is connected for passing the data received at the DATA input to the Hogge circuit to a DATAOUT terminal 24.

Although the charged node LP2 should assume an intended equilibrium potential, it has been found in a prior proposal for a phase locked loop circuit having a similar construction to that shown in FIG. 1, but without a charge pump in accordance with the invention (and without the CK input shown in FIG. 1) as will be explained in more detail below, it has been found that the charged node can drift away from the intended equilibrium point.

Figure 2:
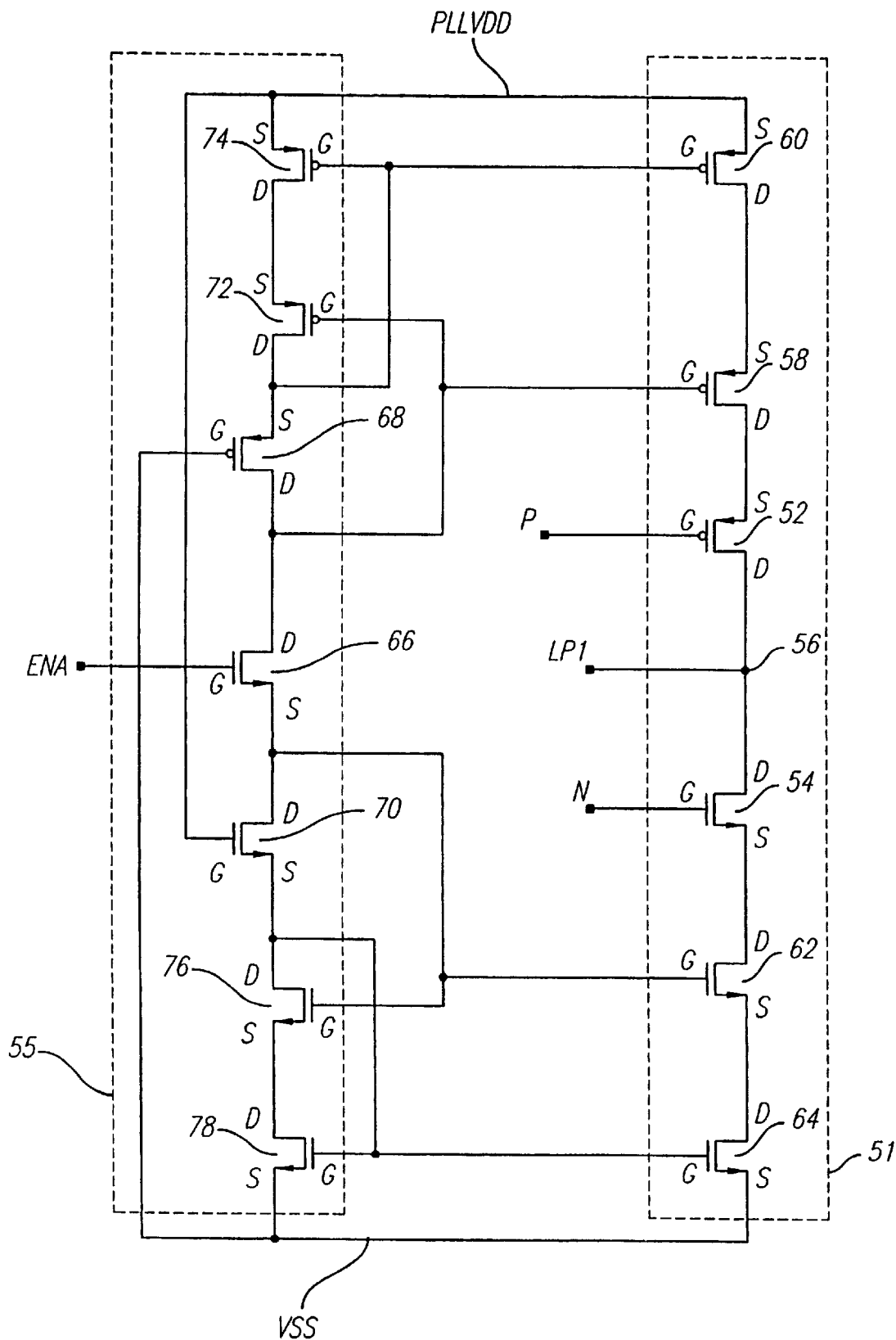
FIG. 2 is a schematic diagram of a conventional charge pump which can be used in part of the circuitry of the phase locked loop of FIG. 1.
Figure 3:
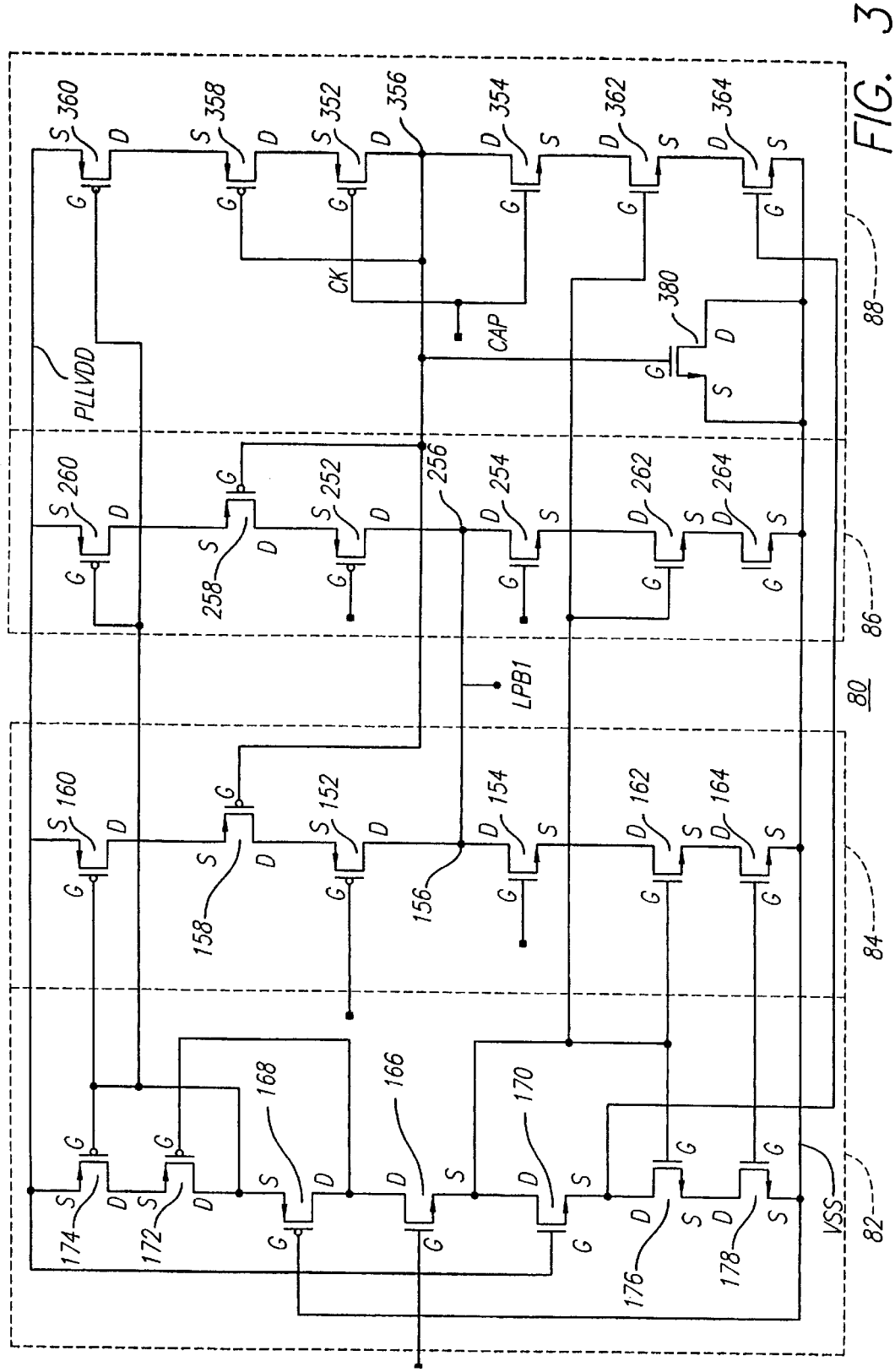
FIG. 3 is a schematic diagram of an embodiment of a charge pump in accordance with the present invention which can be used in a further part of the phase locked loop circuit of FIG. 1.

FIG. 2 is a schematic representation of the charge pump 36 shown in FIG. 1. FIG. 2 illustrates an exemplary implementation of the pump circuit. In FIGS. 2 and 3, it should be noted that the letters S, G and D indicate the source, gate and drain, respectively, of the transistors.

In FIG. 2, the charge pump comprises a main charge circuit 51 and a mirror circuit 55. The charge pump circuit 51 includes a P-channel metal oxide semiconductor (PMOS) switching transistor 52 connected to the P input of the charge pump for receiving the UP signal from the phase and frequency detector 34, and an N-channel metal oxide semiconductor (NMOS) transistor 54 connected to the N input of the charge pump 36 for receiving the DN signal from the phase and frequency detector 34. The PMOS switching transistor 52 and the NMOS switching transistor 54 operate alternately in response to the UP and DN signals to charge and discharge the filter capacitor at the terminal LP2 via the output LP1 56 of the charge pump 36. The PMOS switching transistor 52 is connected to a voltage rail PLLVDD via a constant current source comprising PMOS transistors 58 and 60 connected in a cascode configuration. Likewise, the NMOS switching transistor 54 is connected to a voltage rail VSS via a constant current source comprising NMOS transistors 62 and 64 connected in a cascode configuration.

The reference circuit 55 receives the enable input ENA at a transistor switch 66. The transistors 52, 54, 58, 60, 62 and 64 are mirrored by transistors 68, 70, 72, 74, 76 and 78, respectively, in the reference circuit 55 to accurately define the biasing of the switching transistors 52 and 54. The use of multiple cascode stages in the main pump circuit and the reference circuit provide excellent linearity and current control. A charge pump as shown in FIG. 2 can be used as the charge pump 36 in an embodiment of the invention as shown in FIG. 1.

In the aforementioned prior proposal for a phase locked loop circuit having the general structure shown in FIG. 1 (but designed for operation at 155 as opposed to 622 Mhz) proposed the use of two circuits as shown in FIG. 2 for the second charge pump 46 (without the feedback to the CK input of the charge pump 24 shown in FIG. 1). Two such circuits were needed because of the four signals P1, N1, P2 and N2 output from the Hogge circuit 44. However, as also indicated above, it has been determined that the prior proposal did not achieve the desired stability of operation under certain high frequency conditions. Despite careful matching of process characteristics and circuit layout to provide stability, drift from the intended equilibrium point was detected under certain operating conditions. After extensive investigations, it was determined that the possible cause could be inherent differences caused by charge mobility in PMOS and NMOS transistors, which result in different diffusion characteristics, even when process characteristics are perfectly matched.

FIG. 3 is a schematic representation of a charge pump in accordance with an embodiment of the invention for use as the charge pump 46 of FIG. 1. In the embodiment of a charge pump 80 shown in FIG. 3, there is a reference stage 82, a first main pump circuit 84, a further main pump circuit 86, and an auxiliary pump circuit 88.

The main charge pump 84 comprises a PMOS switching transistor 152 and an NMOS switching transistor 154 connected to receive the P1 and N1 signals, respectively, from the Hogge circuit 44. The common point 156 between the first and second switching transistors 152 and 154 forms a switched output which is connected to the terminal LPB1 for connection to the capacitor at terminal LP2 (not shown) in FIG. 1.

A current source comprising PMOS transistors 158 and 160 is connected between a voltage rail PLLVDD and the source of the PMOS switching transistor 152. A current source formed by NMOS transistors 162 and 164 is connected between a voltage rail VSS and the source of the NMOS switching transistor 154.

The further main charge pump 86 comprises a PMOS switching transistor 252 and an NMOS switching transistor 254 connected to receive the P2 and N2 signals, respectively, from the Hogge circuit 44. The common point 256 between the first, and second switching transistors 252 and 254 forms a switched output which is connected to the terminal LPB1 for connection to the capacitor at terminal LP2 (not shown) in FIG. 1.

A current source comprising PMOS transistors 258 and 260 is connected between a voltage rail PLLVDD and the source of the PMOS switching transistor 252. A current source formed by NMOS transistors 262 and 264 is connected between a voltage rail VSS and the source of the NMOS switching transistor 254.

The reference circuit 82 of FIG. 3 is substantially the same as the reference circuit 55 of FIG. 2. For example, the enable signal ENA is received at a transistor 166, and transistors 170, 176 and 178 provide a current mirror to transistors 154, 162 and 161 of the main pump circuit and the transistors 254, 262 and 264 of the further main pump circuit 86. Transistors 168, 172 and 174 also provide current mirrors for transistors 152, 158 and 160 of the main pump circuit 84 and transistors 252, 258 and 260 of the further main pump circuit 86.

However, whereas the gate of the PMOS transistor 58 is connected to the gate of the PMOS transistor 72 in FIG. 2, it will be noted that in the circuit of FIG. 3 the gates of the PMOS transistors 158 and 258 are connected to the auxiliary pump circuit 88. The auxiliary pump circuit 88 has a similar overall structure to the main and further main pump circuits 84 and 86. In particular, there is a PMOS switching transistor 352 and a NMOS switching transistor 354. The common point 356 between the PMOS switching transistor 352 and NMOS switching transistor 354 is connected to the gates of the PMOS transistors 158 and 258 of the main and further main pump circuits 84 and 86, respectively. A current source comprising PMOS transistors 358 and 360 is connected between the source of the PMOS switching transistor 352 and the voltage rail PLLVDD. A current supply comprising NMOS transistors 362 and 364 is connected between the source of NMOS switching transistor 354 and the voltage rail VSS.

The current supply formed by the NMOS transistors 362 and 364 is connected to the reference circuit 82 in the same manner as the corresponding transistors 162 and 164 of the main pump circuit 84 and the corresponding transistors 262 and 264 of the further main pump circuit 86. Similarly, the PMOS transistor 360 is connected to the reference circuit 82 and the gate of the PMOS transistor 358 is connected to the common point 356 between the PMOS switching transistor 352 and the NMOS switching transistor 354 of the auxiliary pump circuit 88. The common point 356 is also connected via a connection CAP to the gate of a transistor 380 which acts as a reference capacitor for the auxiliary pump circuit 88. The source and drain of the reference capacitance transistor 380 are both connected to the voltage supply rail VSS. As shown in FIG. 3, the reference capacitance transistor 380 is an integral part of the charge pump. Alternatively, the capacitance could be provided as an external reference capacitor/capacitance via a CAP output from the pump circuit 46.

The gate of the PMOS switching transistor 352 and the gate of the NMOS switching transistor 354 of the auxiliary pump circuit 88 are connected in common to a clock signal input CK to the pump circuit. The clock signal input CK is connected to receive the output clock signal CKOUT at the terminal 20 in FIG. 1. Accordingly, the auxiliary pump circuit operates at its maximum expected rate to charge and discharge its own capacitor (for example, as implemented in FIG. 3, the reference capacitance transistor 380).

If, as a result of differing charge mobility, the charging cycle of the PMOS transistor does not supply as much charge as is taken by the discharge cycle of the NMOS transistor 354, the result will be that charge will drain away from the reference capacitance transistor 380. As a consequence, the voltage at the common reference point 356 will tend to drop. This drop in voltage at the reference point 356 will cause an increase in the drive provided by the PMOS transistors 358 which will in turn cause the PMOS switching transistor 352 to drive the common reference point 356 back towards the intended equilibrium potential.

In other words, if the PMOS drive is weak, then the capacitor reference voltage goes down which results in more drive being supplied to the PMOS transistor 352 compensating for the effect of the weak PMOS transistor. Consequently, the effectiveness of the PMOS and NMOS switching transistors 352 and 354 can be matched in a dynamic manner.

It will be appreciated from the circuit of FIG. 3 that the feedback control provided in the auxiliary pump circuit 88 is mirrored to the main and further main pump circuits 84 and 86. Where the corresponding transistors of the reference circuit, the main, further main and auxiliary pump circuits are manufactured on an integrated circuit by a common process, and are subjected in use to common variations in voltage and temperature (this could also be achieved for discrete component systems), the feedback loop provided in the auxiliary pump circuit 88 can provide automatic compensation of the biasing to the PMOS switching transistors 152 and 252 of the main and further main pump circuits 84 and 86 to provide matched operation of the PMOS and NMOS switching transistors of the respective pump circuit.

FIG. 4 is a schematic block diagram of an implementation of an integrated circuit 400 including a phase locked loop 10 as shown in FIG. 1. Only those features of the integrated circuit which are relevant to an understanding of the present implementation are described. It will be appreciated that the integrated circuit will include additional inputs and outputs, for example for the supply voltages, inputs and outputs to the other processing circuitry, etc, and that it may include circuit blocks other than those shown in FIG. 4.

As shown in FIG. 4, the phase locked loop 10 of FIG. 1 is connected to a plurality of input/output pins. The DATA input 14 of the phase locked loop 10 is connected to a pin 410 for connection to a source of a 622 MHz data signal 412. A REFIN input 16 of the phase locked loop 10 is connected to a pin 414 for connection to a 77 MHz crystal oscillator 416. The LP2 terminal 22 of the phase locked loop 10 is connected to a pin 418 for connection to a second order low pass filter 420 including or forming the external charge storage for the main charge pumps.

The 77 MHz pin 414 is also connected to one input of a lock detector 424. The other input to the lock detector 424 is connected to a divide-by-eight circuit 422. The input to the divide-by-eight circuit 422 is connected to the CKOUT terminal 20 of the phase locked loop. The lock detector 424 controls the MODEA signal dependent upon a comparison of output of the phase locked loop divided by eight to the clock signal from the 77 MHz oscillator. When lock is found, then the MODEA signal is set low and thereafter the operation of the phase locked loop 10 operates in the second mode or phase of operation in response to the 622 MHz data signal. If phase lock is maintained, then the lock detector maintains the MODEA signal low. If, however, the lock detector detects that lock is lost, then the MODEA signal is set high and the phase locked loop 10 returns to comparing the REFIN signal to the fed back CK signal until lock is re-established.

FIG. 4 also shows other processing circuitry dependent upon the clock and data signals receiving both the data and clock signals from the DATAOUT and CKOUT terminals 24 and 20 of the phase locked loop 10. The integrated circuit 400 can also include other circuitry (not shown) which is not dependent on the data and/or clock signals (DATA and CK). Also, although direct connections are shown between the terminals of the phase locked loop 10 and the pins of the integrated circuit, other intermediate circuitry could be provided as appropriate.

Accordingly, there has been described a charge pump which includes a self-compensated switching drive. The use of an auxiliary pump circuit alongside the main pump circuit can provide automatic feedback control of the operation of the switching transistors of the main pump circuit(s). In a preferred embodiment of the invention, the auxiliary pump circuit is constructed on the same integrated circuit as the main pump circuit and adjacent to the main pump circuit(s). The auxiliary pump circuit is substantially identical in geometry and construction to the main pump circuit(s). The auxiliary pump circuit charges an auxiliary capacitor, which may be integrated within the charge pump structure, or could be provided externally. The main charge pump(s) charge an external capacitor and other components which may form part of a loop filter in a phase locked loop element.

By connection to the generated frequency, the auxiliary pump stage is switched at the maximum operational frequency. The potential on the auxiliary capacity is an indication of the relative strengths of the PMOS and NMOS switching transistors operating dynamically, and subject to process, voltage and temperature variations. The potential is fed back to bias the PMOS transistors so as to stabilise the system, whereby an equilibrium point is obtained. The potential is also used to control the main pump circuit(s) transistors. The main charge pump(s) are therefore caused to operate at an optimum level and to maintain the correct potential for phase locked loop functioning. The charge on the auxiliary capacitor is proportional to the relative dynamic characteristics of the PMOS and NMOS transistors which provide the charging pulses at the system maximum speed irrespective of variations in process, voltage and temperature.

Although a particular embodiment of the invention has been described, it will be appreciated that many modifications and/or additions may be made thereto without departing from the scope of the invention. For example, although an integrated circuit has been described the invention could also be applied where one or more discrete components or component parts are used. Also, although in the specific embodiment a main and a further main charge pump circuit 84 and 86 are provided, in an alternative embodiment only one main charge pump circuit may be provided (for example, main pump circuit 84). Thus, for example, a circuit as described with reference to FIG. 3, but with the omission of the further main pump circuit 86 could be used to implement the charge pump 35 of FIG. 1. Also, in alternative embodiments of a phase locked loop circuit as described in FIG. 1, it may be desired to use a two-way Hogge circuit in place of the four-way Hogge circuit 44 of FIG. 1. In that case, the two-way Hogge circuit would provide only first and second outputs (for example, P1 and N1). Accordingly, it would only be necessary to use a single main pump circuit such as the main pump circuit 84 in the charge pump 46. Also, although an embodiment of the invention for a 622 MHz frequency has been described, it will be appreciated that the invention could also be applied to circuits for other lower frequencies (e.g 155 MHz) or higher frequencies.

It will be appreciated that other embodiments of the invention could provide alternative current source and reference circuit constructions. Also, although the invention has been described in particular with reference to CMOS circuitry, the invention could also be applied to other circuit technologies.

I claim:

1. A charge pump comprising:
   a main pump circuit having a main first and second switching transistors; and
   an auxiliary pump circuit having a first auxiliary element for increasing a variable bias in response to a clock signal, and having a second auxiliary element for decreasing said variable bias in response to said clock signal;
   said charge pump being configured to provide said variable bias to at least said first switching transistor in response to operation of said auxiliary pump circuit.

2. A charge pump according to claim 1, wherein said first and second auxiliary elements comprise auxiliary first and second switching transistors.

3. A charge pump according to claim 2, wherein said auxiliary first and second switching transistors are coupled or couplable to auxiliary charge storage for controlling a charging level for said charge storage.

4. A charge pump according to claim 3, wherein said charge storage comprises one or more transistors.

5. A charge pump according to claim 3, wherein said charge storage comprises one or more capacitors.

6. A charge pump according to claim 1, wherein said auxiliary pump circuit includes a self-regulating feedback loop.

7. A charge pump according to claim 3, wherein an auxiliary controllable current source is connected between said auxiliary first switching transistor and a voltage supply line, said auxiliary controllable current source being responsive to a charging level of said charge storage to provide a self-regulating bias to said auxiliary first switching transistor.

8. A charge pump according to claim 7, wherein said auxiliary controllable current source comprises a bias transistor responsive to a charging level of said charge storage to provide a self-regulating bias to said auxiliary first switching transistor.

9. A charge pump according to claim 1, wherein a main controllable current source is connected between said main first switching transistor and a voltage supply line, said main controllable current source being responsive to operation of said auxiliary pump circuit.

10. A charge pump according to claim 8, wherein a main controllable current source is connected between said main first switching transistor and a voltage supply line and said main controllable current source comprises a bias transistor responsive to a charging level of said charge storage to provide a self-regulating bias to said main first switching transistor.

11. A charge pump comprising:
a main pump circuit having a main first and second switching transistors;
an auxiliary pump circuit;
a further main pump circuit having further main first and second switching transistors,
said charge pump being configured to provide a variable bias to at least said first switching transistor and said further main first switching transistor in response to operation of said auxiliary pump circuit.

12. A charge pump comprising:
a main pump circuit having a main first and second switching transistors;
an auxiliary pump circuit;
a main controllable current source connected between said first main switching transistor and a voltage supply line, said main controllable current source being responsive to operation of said auxiliary pump circuit; and
a further main pump circuit having further main first and second switching transistors and a further main controllable current source connected between said further main first switching transistor and a voltage supply line, said further main controllable current source being responsive to operation of said auxiliary pump circuit;
said charge pump being configured to provide a variable bias to at least said first switching transistor in response to operation of said auxiliary pump circuit.

13. A charge pump comprising:
a main pump circuit having a main first and second switching transistors; and
an auxiliary pump circuit comprising auxiliary first and second switching transistors coupled or couplable to auxiliary charge storage for controlling a charging level for said charge storage;
a main controllable current source comprising a bias transistor responsive to a charging level of said charge storage to provide a self-regulating bias to said main first switching transistor, said main controllable current source being connected between said main first switching transistor and a voltage supply line;
an auxiliary controllable current source comprising a bias transistor responsive to a charging level of said charge storage to provide a self-regulating bias to said auxiliary first switching transistor, said auxiliary controllable current source being connected between said auxiliary first switching transistor and a voltage supply line;
a further main pump circuit having further main first and second switching transistors and a further main controllable current source connected between said further main first switching transistor and a voltage supply line, said further main controllable current source comprising a bias transistor responsive to a charging level of said charge storage to provide a self-regulating bias to said further main first switching transistors;
said charge pump being configured to provide a variable bias to at least said first switching transistor in response to operation of said auxiliary pump circuit.

14. A charge pump according to claim 1, wherein said first switching transistor is a PMOS transistor.

15. A charge pump according to claim 1, wherein said second switching transistor is an NMOS transistor.

16. A charge pump according to claim 1, wherein said auxiliary pump circuit is configured to be operable at a maximum operational frequency for said charge pump circuit.

17. A charge pump comprising:
a main pump circuit having a main first and second switching transistors; and
an auxiliary pump circuit configured to be operable at a maximum operational frequency of said charge pump circuit;
said charge pump being configured to provide a variable bias to at least said first switching transistor in response to operation of said auxiliary pump circuit;
wherein the gates of auxiliary first and second switching transistors of said auxiliary pump circuit are each driven by a clock frequency corresponding to said maximum operational frequency clock.

18. A charge pump according to claim 1, wherein each pump circuit has substantially the same geometry.

19. A charge pump according to claim 1, further comprising a current mirror reference circuit.

20. A phase locked loop comprising a charge pump according to claim 1.

21. An integrated circuit comprising a charge pump according to claim 1.

* * * * *